United States Patent
Chua et al.

(10) Patent No.: US 7,922,352 B2
(45) Date of Patent: Apr. 12, 2011

(54) DEVICE AND METHOD FOR EMITTING OUTPUT LIGHT USING MULTIPLE LIGHT SOURCES WITH PHOTOLUMINESCENT MATERIAL

(75) Inventors: Janet Bee Yin Chua, Perak (MY); Yue Hoong Lau, Penang (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 1662 days.

(21) Appl. No.: 11/186,221

(22) Filed: Jul. 21, 2005

(65) Prior Publication Data

US 2007/0018558 A1   Jan. 25, 2007

(51) Int. Cl.
*F21K 2/08*   (2006.01)

(52) U.S. Cl. .......................................... 362/231; 362/84

(58) Field of Classification Search .................. 362/231, 362/84, 230; 313/501; 257/94, 89
See application file for complete search history.

(56) References Cited

U.S. PATENT DOCUMENTS

| | | | | |
|---|---|---|---|---|
| 5,748,161 A | * | 5/1998 | Lebby et al. | 345/84 |
| 5,836,676 A | * | 11/1998 | Ando et al. | 362/244 |
| 5,874,803 A | * | 2/1999 | Garbuzov et al. | 313/506 |
| 6,219,364 B1 | * | 4/2001 | Dei | 372/36 |
| 6,345,903 B1 | * | 2/2002 | Koike et al. | 362/241 |
| 6,351,069 B1 | | 2/2002 | Lowery et al. | |
| 7,554,257 B2 | * | 6/2009 | Krummacher et al. | 313/501 |
| 2004/0012027 A1 | * | 1/2004 | Keller et al. | 257/79 |
| 2004/0262617 A1 | * | 12/2004 | Hahm et al. | 257/79 |

FOREIGN PATENT DOCUMENTS

JP    56041669 A   *   4/1981

\* cited by examiner

*Primary Examiner* — Sharon E Payne (57) ABSTRACT

A device and method for emitting output light utilizes multiple light sources to produce original light having different peak wavelengths. A first light source of the device is configured to generate first light having a peak wavelength in the blue wavelength range, while a second light source of the device is configured to generate second light having a peak wavelength in the red wavelength range. Some of the original light emitted from at least the first light source is converted into light having a peak wavelength longer than the peak wavelength of the original light using a photoluminescent material to produce the output light.

15 Claims, 6 Drawing Sheets

DEVICE AND METHOD FOR EMITTING OUTPUT LIGHT USING MULTIPLE LIGHT SOURCES WITH PHOTOLUMINESCENT MATERIAL

BACKGROUND OF THE INVENTION

Conventional light emitting devices, such as incandescent, halogen and fluorescent lamps, have not been significantly improved in the past twenty years. However, light emitting diode ("LEDs") have been improved to a point with respect to operating efficiency where LEDs are now replacing the conventional light emitting devices in traditional monochrome lighting applications, such as traffic signal lights and automotive taillights. This is due in part to the fact that LEDs have many advantages over conventional light emitting devices. These advantages include longer operating life, lower power consumption, and smaller size.

LEDs use semiconductor LED dies as light sources, which typically produce monochromatic light. Currently, LEDs are available in various colors from UV-blue to green, yellow and red. Due to the narrow-band emission characteristics of the LED dies, these LEDs cannot be directly used for "white" light applications. Rather, the output light of a monochromatic LED die must be mixed with other light of one or more different wavelengths to produce white light. Two common approaches for producing white light include (1) packaging individual red, green and blue LED dies together so that light emitted from these LED dies are combined to produce white light and (2) introducing a photoluminescent material into a UV, blue or green LED so that some or all of the original light emitted by the semiconductor die of the LED is converted into longer wavelength light and combined with the original blue or green light to produce white light.

Between these two approaches for producing white light using monochromatic LED dies, the second approach is generally preferred over the first approach. In contrast to the second approach, the first approach requires a more complex driving circuitry since the red, green and blue LED dies have different operating voltage requirements. Furthermore, failure to properly mix the light emitted from the different LED dies may result in output light with uneven color. In addition, since different types of semiconductor LED dies are used, the resulting mixed light is subject to variations due to the different operating characteristics of these LED dies with respect to temperature, chronological change and operating environment.

A concern with the second approach is that the resulting white light may not have a high color-rendering index, which is required for certain backlighting and illumination applications. As an example, a white LED that uses a blue LED die with YAG:Ce phosphor will produce white light that is deficient in the red wavelength region.

In view of the above concerns, there is a need for a device and method for emitting white output light having a high color-rendering index.

SUMMARY OF THE INVENTION

A device and method for emitting output light utilizes multiple light sources to produce original light having different peak wavelengths. A first light source of the device is configured to generate first light having a peak wavelength in the blue wavelength range, while a second light source of the device is configured to generate second light having a peak wavelength in the red wavelength range. Some of the original light emitted from at least the first light source is converted into light having a peak wavelength longer than the peak wavelength of the original light using a photoluminescent material to produce the output light. The device and method can be used to produce white output light having a high color-rendering index.

A device for emitting output light in accordance with an embodiment of the invention comprises a mounting structure, a first light source, a second light source and a wavelength-shifting region. The first and second light sources are positioned over the mounting structure. The first light source is configured to generate first light having a peak wavelength in the blue wavelength range. The second light source is configured to generate second light having a peak wavelength in the red wavelength range. The wavelength-shifting region is optically coupled to at least the first light source. The wavelength-shifting region includes a photoluminescent material having a property to convert at least some of the first light into third light having a peak wavelength longer than the peak wavelength of the first light. The first light, the second light and the third light are components of the output light.

The device may be used as a light source device for an illumination apparatus, such as an LCD backlighting apparatus. An illumination apparatus in accordance with an embodiment of the invention comprises at least one light emitting device and a light transmitting panel. The light emitting device comprises a mounting structure, a first light source, a second light source and a wavelength-shifting region. The first and second light sources are positioned over the mounting structure. The first light source is configured to generate first light having a peak wavelength in the blue wavelength range. The second light source is configured to generate second light having a peak wavelength in the red wavelength range. The wavelength-shifting region is optically coupled to at least the first light source. The wavelength-shifting region includes a photoluminescent material having a property to convert at least some of the first light into third light having a peak wavelength longer than the peak wavelength of the first light. The first light, the second light and the third light are components of output light emitted from the light emitting device. The light transmitting panel is optically coupled to the light emitting device to receive the output light. The light transmitting panel is configured to provide illumination using the output light of the light emitting device.

A method for emitting output light from a light emitting device in accordance with an embodiment of the invention includes generating first light having a peak wavelength in the blue wavelength range from a first light source of the light emitting device, generating second light having a peak wavelength in the red wavelength range from a second first light source of the light emitting device, receiving the first light at a wavelength-shifting region optically coupled to at least the first light source, including converting some of the first light into third light having a peak wavelength longer than the peak wavelength of the first light using a photoluminescent material contained in the wavelength-shifting region, and emitting the first light, the second light and the third light as components of the output light Other aspects and advantages of the present invention will become apparent from the following detailed description, taken in conjunction with the accompanying drawings, illustrated by way of example of the principles of the invention.

DETAILED DESCRIPTION

Figure 1:
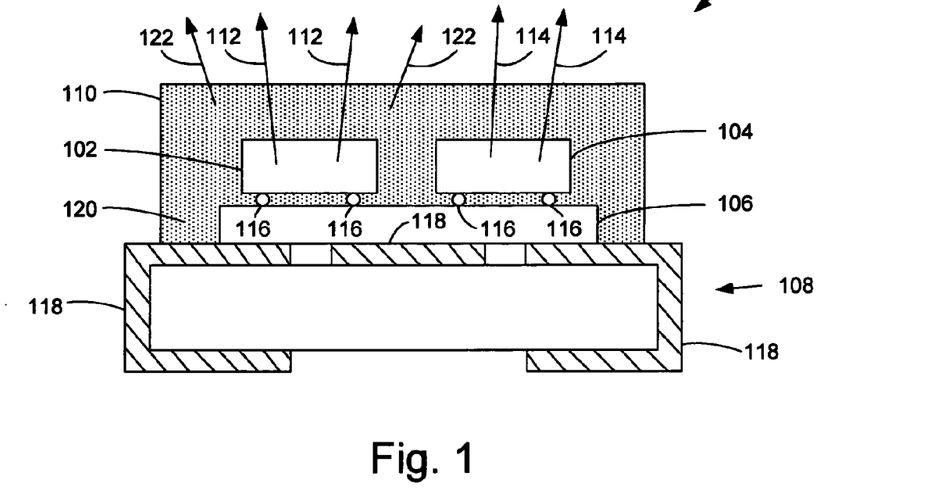
FIG. 1 is a diagram of an LED in accordance with an embodiment of the invention.

With reference to FIG. 1, a light emitting diode (LED) 100 in accordance with an embodiment of the invention is described. The LED 100 is designed to produce "white" color output light having a high color-rendering index. In this embodiment, the LED 100 is a surface mount LED. However, in other embodiments, the LED 100 may be a different type of LED, such as a leadframe-mounted LED. As shown in FIG. 1, the LED 100 includes LED dies 102 and 104, an optional submount 106, a mounting structure 108 and an encapsulant 110.

The LED dies 102 and 104 are light sources for the LED 100. The LED dies 102 and 104 are semiconductor chips that generate light having a particular peak wavelength. The LED die 102 is configured to generate light having a peak wavelength in the blue wavelength range of the visible spectrum, which is approximately 420 nm to 490 nm. This blue light is illustrated in FIG. 1 by the arrows 112. The LED die 104 is configured to generate light having a peak wavelength in the red wavelength range of the visible spectrum, which is approximately 620 nm to 800 nm. This red light is illustrated in FIG. 1 by the arrows 114.

As shown in FIG. 1, the LED dies 102 and 104 are attached to the optional submount 106, which is attached to the mounting structure 108. In other embodiments, the LED dies 102 and 104 may be directly attached to the mounting structure 108. The LED dies 102 and 104 may be attached to the submount 106 or the mounting structure 108 using an electrically conductive and adhesive material, such as solder 116. The submount 106 provides a thermal conductive path from the LED dies 102 and 104 to the mounting structure 108 to dissipate thermal energy from the LED dies. The submount 106 also provides a thermal expansion buffer between the LED dies 102 and 104 and the mounting structure 108. The LED 100 is shown in FIG. 1 as having a single submount 106 onto which the LED dies 102 and 104 are attached. However, in an alternative embodiment, the LED 100 may include a submount for each of the LED dies 102 and 104. The mounting structure 108 includes leadframes 118, which provide the electrical power needed to drive the LED dies 102 and 104.

The LED dies 102 and 104 are encapsulated in the encapsulant 110, which is a medium for the propagation of light from the LED dies. The encapsulant 110 can be made of any transparent substance. As an example, the encapsulant 110 can be made of epoxy, silicone, a hybrid of silicone and epoxy, amorphous polyamide resin or fluorocarbon, glass and/or plastic material. The encapsulant 110 also contains a photoluminescent material 120, which has a property to absorb at least some of the blue light emitted from the LED die 102 and produce longer wavelength light, such as light having a peak wavelength in the green wavelength range of the visible spectrum, which is approximately 520 nm to 565 nm. Thus, the photoluminescent material 120 converts some of the blue light from the LED die 102 into green light. This green light is illustrated in FIG. 1 by the arrows 122. In some conventional LEDs, white light is produced by the mixing of the blue light emitted from a blue-emitting LED die and phosphor-converted green light. However, such white light is typically deficient in the red wavelength region of the visible spectrum. In the LED 100, this red deficiency is resolved by the inclusion of the LED die 104, which emits red light that mixes with the original blue light from the LED die 102 and the converted green light to produce white light having a high color-rendering index.

The photoluminescent material 120 in the encapsulant 110 may include phosphors, quantum dots, nano-phosphors, laser dyes, inorganic dyes or organic dyes. Nano-phosphors have similar optical properties as conventional phosphors. However, nano-phosphors are smaller in size than conventional phosphors, but larger than quantum dots. The size of conventional phosphors is in the range of 1-50 microns (typically in the 1-20 micron range). The size of nano-phosphors is smaller than 1 micron, but larger than quantum dots, which may be a few nanometers in size. As an example, the photoluminescent material 120 may include YAG:Ce phosphors.

In this embodiment, the photoluminescent material 120 is distributed throughout the encapsulant 110. Thus, the entire encapsulant 120 functions as a wavelength-shifting region for the blue light emitted from the LED die 102. However, in other embodiments, only a portion of the encapsulant 110 may include the photoluminescent material 120. As an example, in FIG. 2, a portion 224 of the encapsulant 100 over the LED die 102 includes the photoluminescent material 120. Thus, only this portion 224 of the encapsulant 100 is a wavelength-shifting region. The remaining portion 225 of the encapsulant 110 does not include the photoluminescent material 120. In other embodiments, the wavelength-shifting region 224 may be a thin layer covering the LED die 102, or a layer at the upper surface of the encapsulant 110 or at some distance from the LED die 102.

Figure 2:
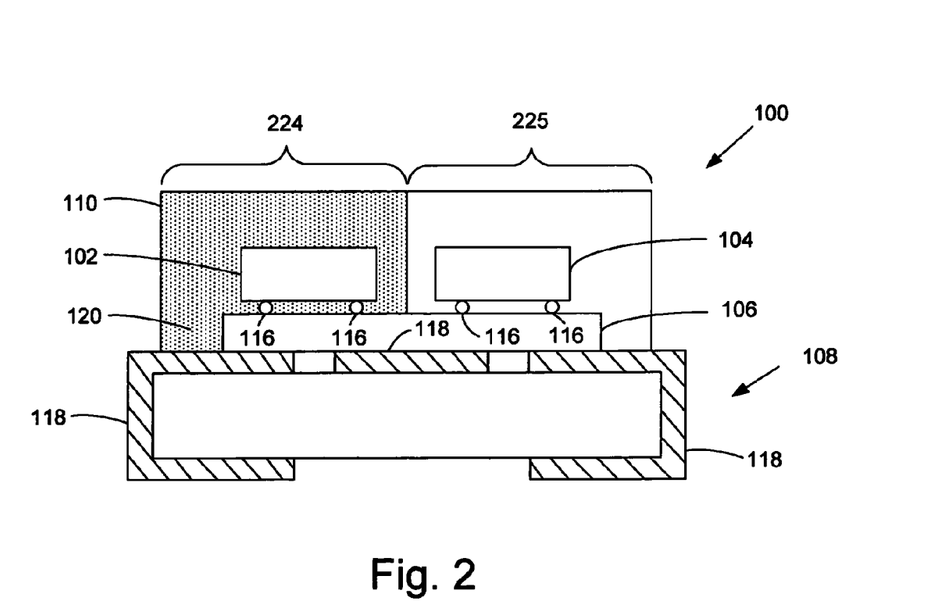
FIG. 2 is a diagram of the LED of FIG. 1 in accordance with another embodiment of the invention.
Figure 3:
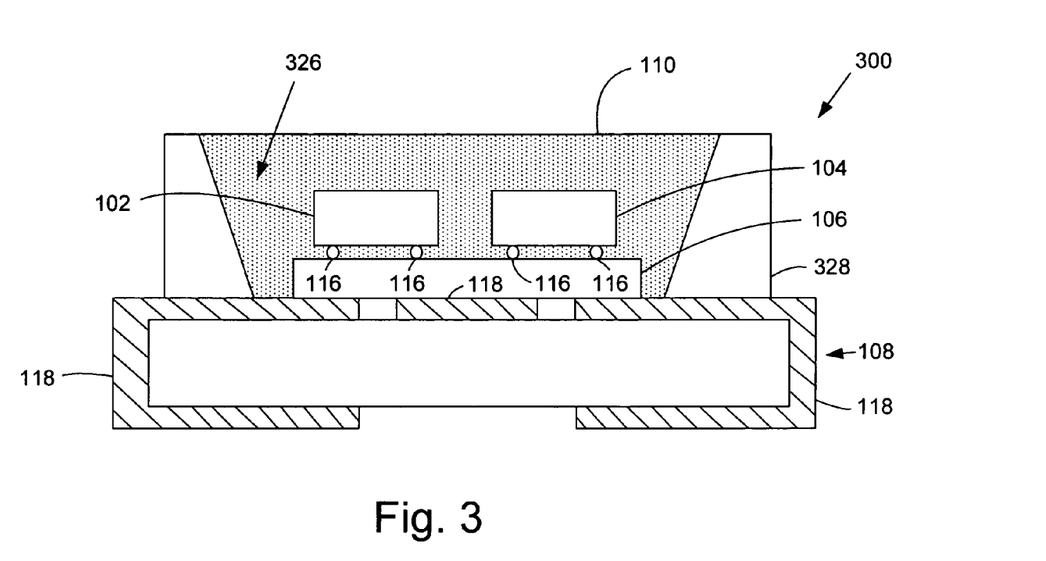
FIG. 3 is a diagram of an LED with a reflector cup in accordance with an embodiment of the invention.

The LED 100 is shown in FIGS. 1 and 2 as being a surface mount LED without a reflector cup. However, the LED 100 may be configured as a surface mount LED with a reflector cup. As an example, a surface mount LED 300 in accordance with an embodiment of the invention is shown in FIG. 3. The same reference numerals used in FIGS. 1 and 2 are used to identify similar elements in FIG. 3. The LED 300 includes the LED dies 102 and 104, the optional submount 106, the mounting structure 108 and the encapsulant 110. The LED 300 further includes a reflector cup 326 formed on a poly(p-phenyleneacetylene) (PPA) housing 328 or a printed circuit board (not shown). As shown in FIG. 3, the entire encapsulant 110 is a wavelength-shifting region. However, in other embodiments, a portion of the encapsulant 110 may be a wavelength-shifting region, as illustrated in FIG. 2.

Figure 4:
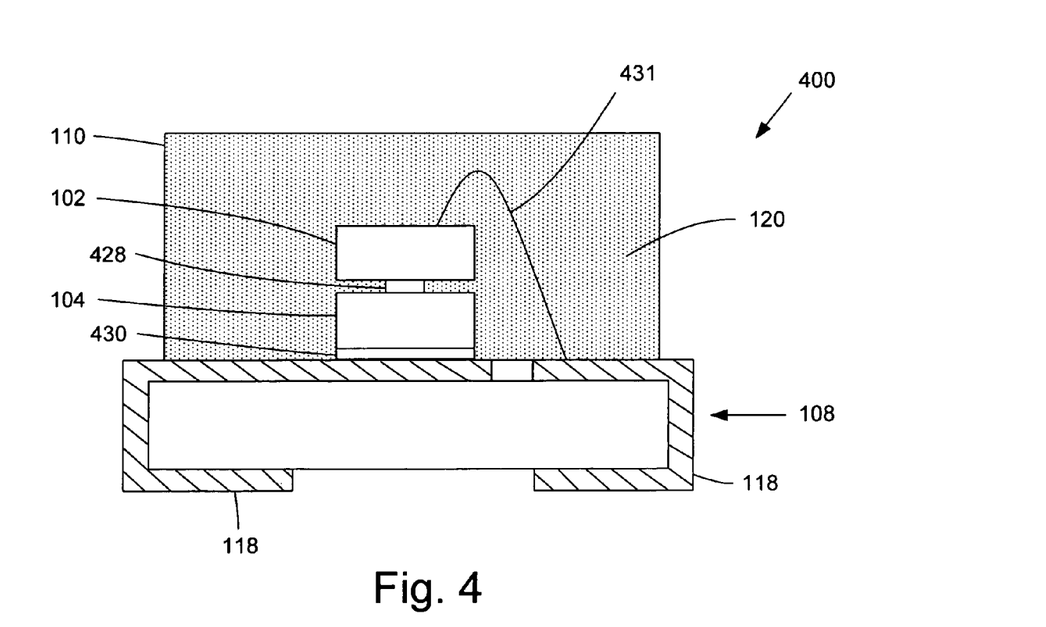
FIG. 4 is a diagram of an LED with stacked LED dies in accordance with an embodiment of the invention.

In an alternative embodiment, the LED dies 102 and 104 of the LEDs 100 and 300 of FIGS. 1, 2 and 3 may be stacked on top of each other, rather than being positioned side-by-side. Turning now to FIG. 4, an LED 400 with stacked LED dies in accordance with an embodiment of the invention is shown. The same reference numerals used in FIGS. 1, 2 and 3 are used to identify similar elements in FIG. 4. In this alternative embodiment, the LED die 102 is stacked on top of the LED die 104, which is attached to the optional submount 106 or directly attached to the mounting structure 108. Thus, the LED dies 102 and 104 are positioned in a stacked arrangement. In the illustrated embodiment, the LED die 102 is attached to the LED die 104 using an adhesive material 428, which is electrically conductive. The LED die 104 is electrically connected to a leadframe 118 of the supporting structure 108 using an adhesive material 430, which is also electrically conductive. The LED die 104 is also electrically connected to another leadframe 118 of the supporting structure 108 via a bond wire 431 so that driving current can be conducted through the stacked LED dies 102 and 104. In an alternative configuration, the LED die 104 may be stacked on top of the LED die 102, which may be attached to the optional submount 106 or directly attached to the mounting structure 108. As shown in FIG. 4, the entire encapsulant 110 contains the photoluminescent material 120, and thus, the entire encapsulant is a wavelength-shifting region. However, in other embodiments, a portion of the encapsulant 110 may be a wavelength-shifting region, as illustrated in FIG. 2. Furthermore, in other embodiments, the LED 400 may further include a reflector cup formed on a PPA housing or a printed circuit board, as illustrated in FIG. 3.

Figure 5:
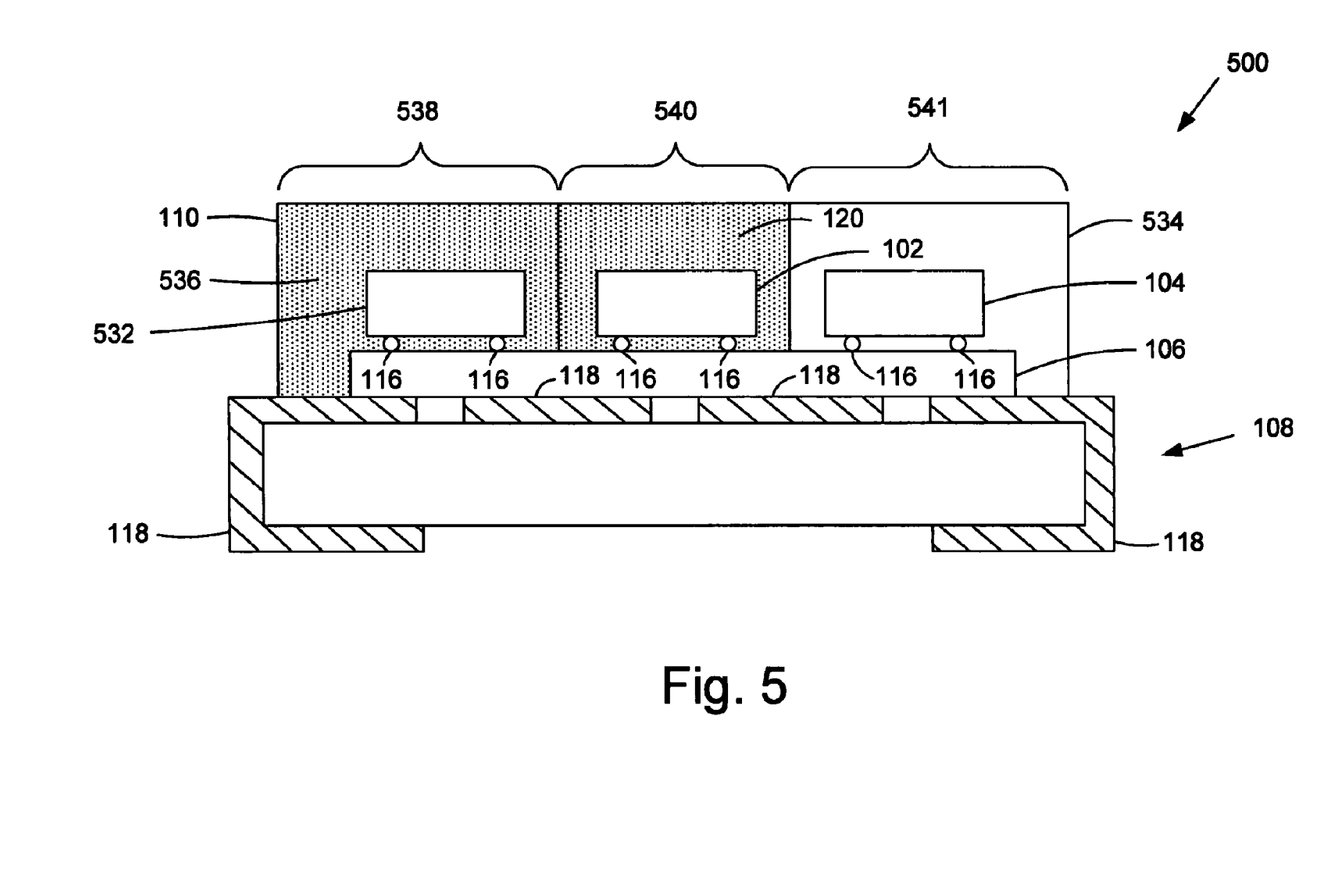
FIG. 5 is a diagram of an LED with three LED dies in accordance with an embodiment of the invention.

Turning now to FIG. 5, an LED 500 in accordance with another embodiment of the invention is shown. The same reference numerals used in FIGS. 1, 2, 3 and 4 are used to identify similar elements in FIG. 5. Similar to the LED 100 of FIGS. 1 and 2, the LED 500 includes the LED dies 102 and 104, the optional submount 106 and the mounting structure 108. However, in this embodiment, the LED 500 includes an additional blue-emitting LED die 532, which can be identical to the LED die 102. As shown in FIG. 5, in this embodiment, the additional LED die 532 is attached to the optional submount 106. However, in other embodiments, the LED die 532 may be attached to a separate submount (not shown), or directly attached to the mounting structure 108.

The LED 500 also includes an encapsulant 534 that contains an additional photoluminescent material 536, as well as the photoluminescent material 120. Thus, the encapsulant 534 of the LED 500 includes two types of photoluminescent material. The photoluminescent material 536 has a property to convert at least some of the blue light emitted from the LED die 532 into light having a peak wavelength in the orange wavelength range of the visible spectrum, which is approximately 590 m to 620 nm. Similar to the photoluminescent material 120, the photoluminescent material 536 may include phosphors, quantum dots, nano-phosphors, laser dyes, inorganic dyes or organic dyes. As an example, the photoluminescent material 536 may include phosphors based on Silicate, Garnet, Sulphide, Thiometallates, Nitride, Orthosilicate, Nitridosilicate and Selenide.

In this embodiment, the encapsulant 534 includes a first wavelength-shifting region 538, which contains the photoluminescent material 536. The wavelength-shifting region 538 is positioned over the LED die 532 so that at least some of the light emitted from the LED die 532 can be converted into longer wavelength "orange" light by the photoluminescent material 536 in the wavelength-shifting region 538. The encapsulant 534 further includes a second wavelength-shifting region 540, which contains the other photoluminescent material 120. This wavelength-shifting region 540 is positioned over the LED die 102 so that at least some of the light emitted from the LED die 102 can be converted into longer wavelength "green" light by the photoluminescent material 120 in the wavelength-shifting region 540. The remaining region 541 of the encapsulant 534 does not contain any photoluminescent material, and thus, is not a wavelength-shifting region. In an alternative embodiment, this region 541 may include a photoluminescent material, such as the photoluminescent material 120 or 536. However, even in the presence of a photoluminescent material, the red light emitted by the LED die 104 will be transmitted through the region 541 without being converted into longer wavelength light. The original red light from the LED die 104, the original blue light from the LED dies 102 and 532, the converted green light and the converted orange light are mixed to produce white output light having a high color rendering index.

Figure 6:
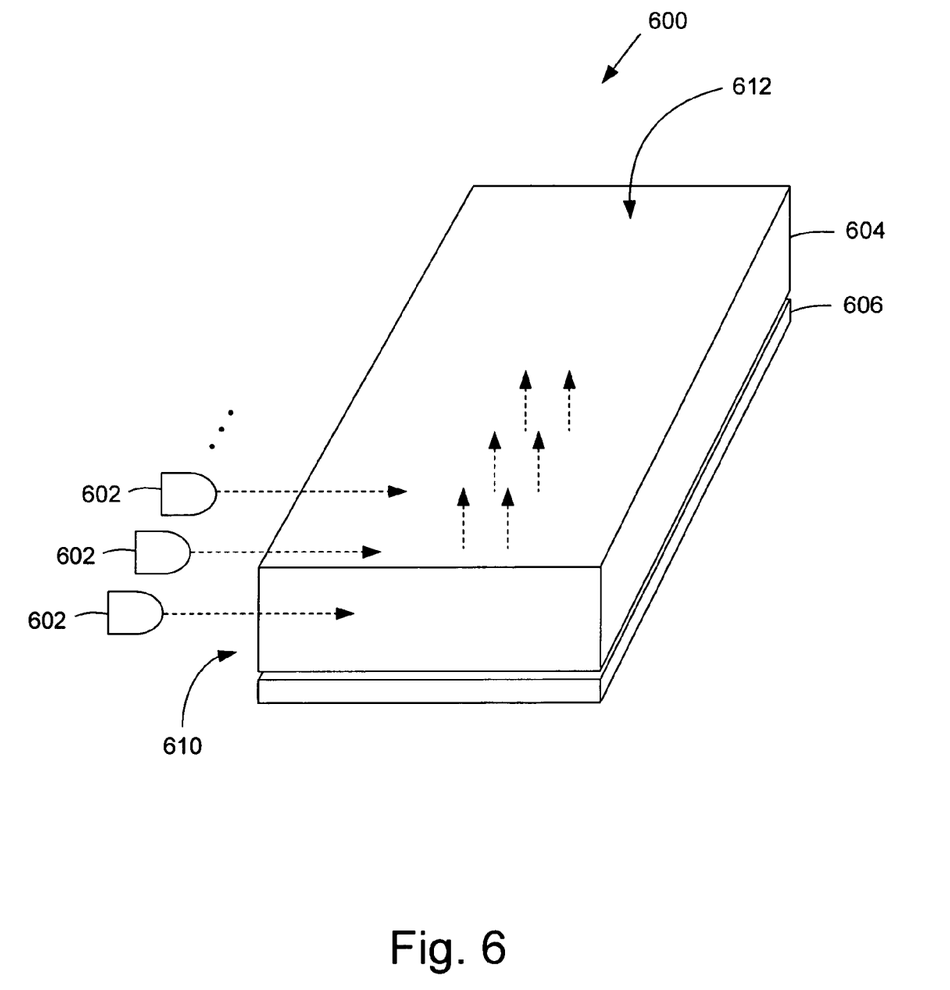
FIG. 6 is a diagram of an LCD backlighting apparatus in accordance with an embodiment of the invention.

The LEDs 100, 300, 400 and 500 in accordance with different embodiments of the invention may be used as light source devices for a variety of lighting applications, for example, backlighting for an illuminated display device, such as a liquid crystal display (LCD). As an example, in FIG. 6, an LCD backlighting apparatus 600 in accordance with an embodiment of the invention is shown. The backlighting apparatus 600 includes a number of LEDs 602, a light panel 604 and a reflector 606. The LEDs 602 serve as light source devices for the backlighting apparatus 600. The LEDs 602 can be any type of LEDs in accordance with an embodiment of the invention. Although only three LEDs are shown in FIG. 6, the backlighting apparatus 600 may include any number of LEDs. As shown in FIG. 6, the LEDs 602 are positioned along a side 610 of the light panel 604. Thus, the output light from the LEDs 602 is transmitted into the light panel 604 through the side 610 of the light panel 604, which faces the LEDs. In other embodiments, the LEDs 602 may be positioned along more than one side of the light panel 604.

The light panel 604 serves to direct the LED light received at the side 610 of the light panel toward the upper surface 612 of the light panel so that illuminating light is emitted from the upper surface of the light panel in a substantially uniform manner. In an exemplary embodiment, the light panel 604 is a light guide panel (also known as "light pipe panel"). Thus, the light panel 604 will also be referred to herein as the light guide panel. However, in other embodiments, the light panel 604 may be any light transmitting panel that can emit illuminating light from a wide surface of the panel using light from one or more LEDs.

Figure 7:
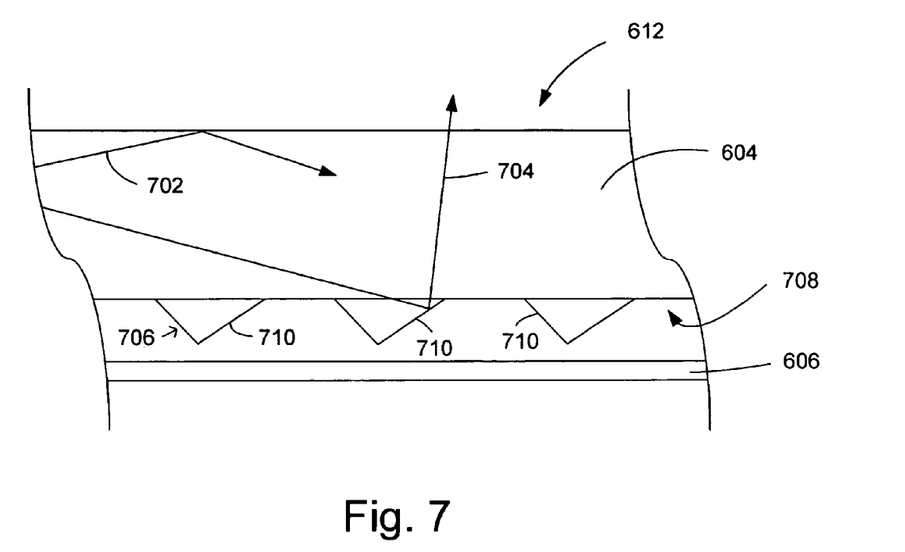
FIG. 7 is a partial cross-sectional diagram of the LCD backlighting apparatus of FIG. 6.

As illustrated in FIG. 7, the light guide panel 604 is designed such that light that is internally incident on the upper surface 612 of the light guide panel at large angles with respect to normal, as illustrated by the arrow 702, is internally reflected, while light that is internally incident on the upper surface at smaller angles, as illustrated by the arrow 704, is transmitted through the upper surface of the light guide panel. The light guide panel 604 may include a light extraction feature 706 to diffuse and scatter the light within the light guide panel so that light is emitted from the upper surface 612 of the light guide panel more uniformly. The light extraction feature 706 may be printed, chemical-etched or laser-etched dots on the bottom surface 708 of the light guide panel 604. Alternatively, the light extraction feature 706 may be a microstructured lens feature, as illustrated in FIG. 7, formed on the bottom surface 708 of the light guide panel 604. As shown in FIG. 7, the microstructured lens feature 706 includes many protrusions 710, which may have V-shaped cross-sectional profiles, that optimize angles of reflected or refracted light so that light can be extracted more uniformly from the upper surface 612 of the light guide panel 604.

As shown in both FIGS. 6 and 7, the reflector 606 is positioned below the light guide panel 604. The reflector 606 serves to reflect light emitted out of the bottom surface 708 of the light guide panel 604 back into the light guide panel so that the light may be emitted from the upper surface 612 of the light guide panel.

Figure 8:
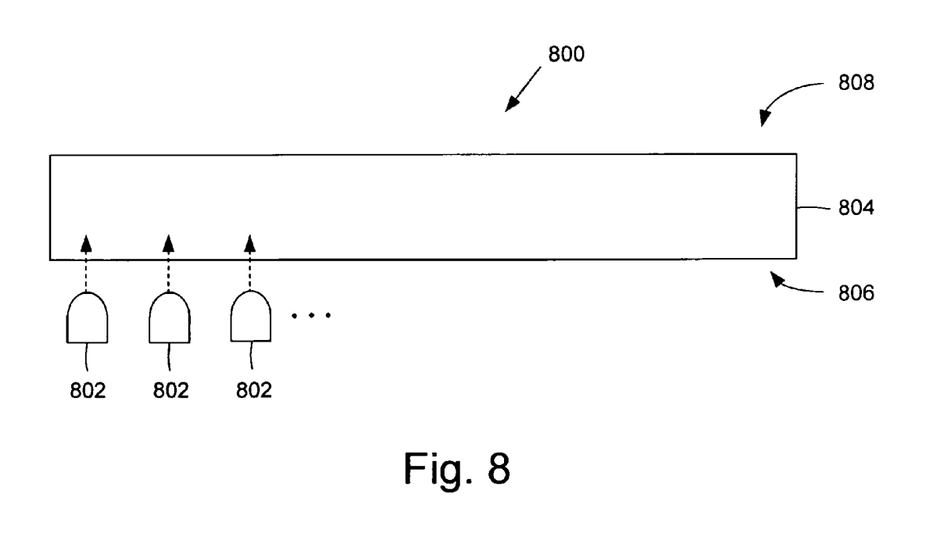
FIG. 8 is a diagram of an LCD backlighting apparatus in accordance with an alternative embodiment of the invention.

Turning now to FIG. 8, an LCD backlighting apparatus 800 in accordance with an alternative embodiment of the invention is shown. Similar to the backlighting device 600 of FIG. 6, the backlighting apparatus 800 includes a number of LEDs 802 and a light panel 804. However, in this embodiment, the LEDs 802 are positioned below the lower surface 806 of the light panel 804, rather than being positioned along a side of the light panel. Thus, light from the LEDs 802 is transmitted into the lower surface 806 of the light panel 804 and emitted out of the upper surface 808 of the light panel as illuminating light. The LEDs 802 of the backlighting apparatus 800 can be any type of LEDs in accordance with an embodiment of the invention. The light panel 804 may be a light guide panel or any other light transmitting panel.

Figure 9:
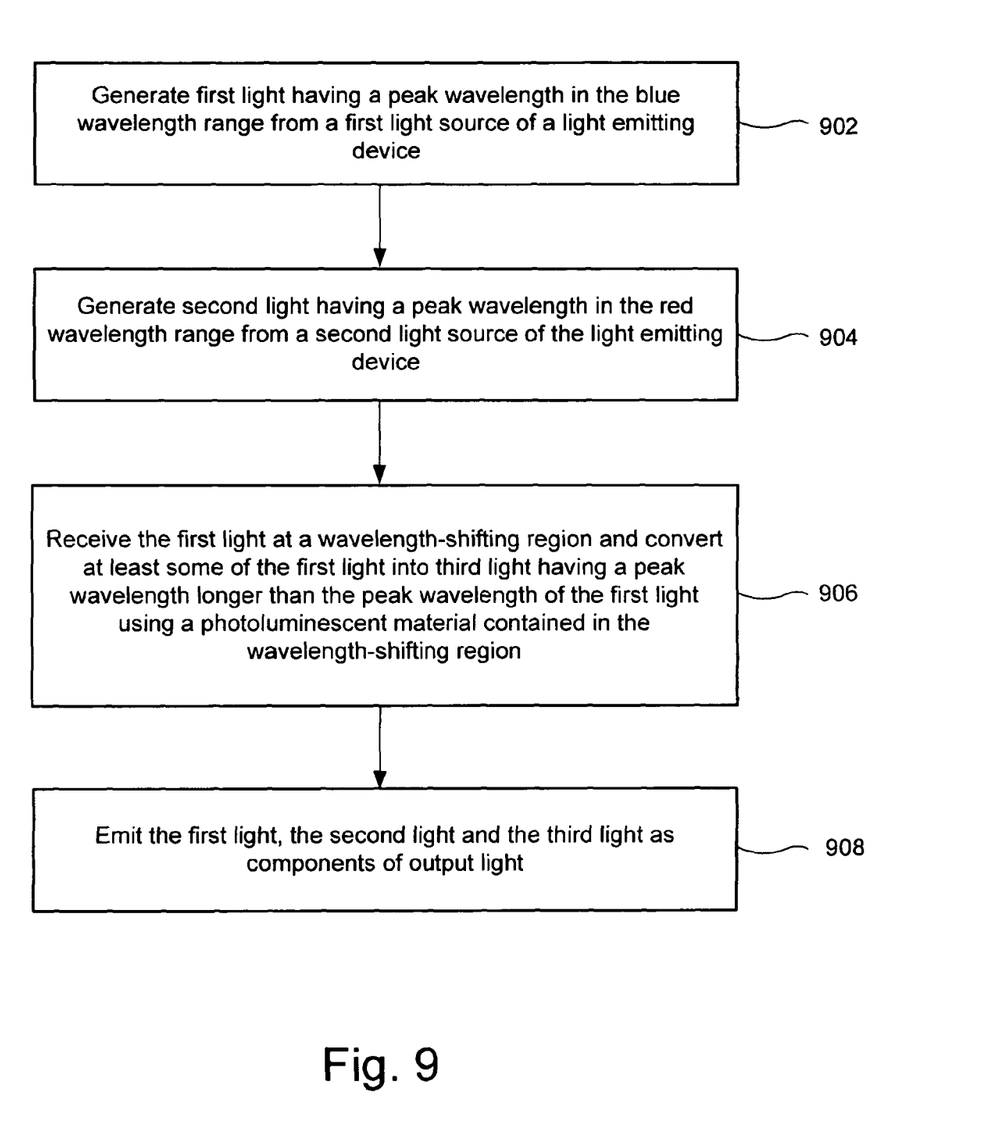
FIG. 9 is a process flow diagram of a method for emitting output light from a light emitting device in accordance with an embodiment of the invention.

A method for producing output light from a light emitting device in accordance with an embodiment of the invention is described with reference to a process flow diagram of FIG. 9. At block 902, first light having a peak wavelength in the blue wavelength range is generated from a first light source of the light emitting device, such as a blue LED die. Next, at block 904, second light having a peak wavelength in the red wavelength range is generated from a second light source of the light emitting device, such as a red LED die. Next, at block 906, the first light is received at a wavelength-shifting region, which contains a photoluminescent material. The wavelength-shifting region is optically coupled to at least the first light source. Furthermore, at block 906, at least some of the first light is converted into third light having a peak wavelength longer than the peak wavelength of the first light using the photoluminescent material contained in the wavelength-shifting region. Next, at block 908, the first light, the second light and the third light are emitted as components of the output light, which may be white output light.

Although specific embodiments of the invention have been described and illustrated, the invention is not to be limited to the specific forms or arrangements of parts so described and illustrated. The scope of the invention is to be defined by the claims appended hereto and their equivalents

What is claimed is:

1. A semiconductor device for emitting output light, the device comprising:
    a mounting structure;
    a first light emitting diode die positioned over the mounting structure, the first light emitting diode die being configured to emit first light having a peak wavelength in the blue wavelength range;
    a second light emitting diode die positioned over the mounting structure, the second light emitting diode die being configured to emit second light having a peak wavelength in the red wavelength range; and
    a transparent encapsulant that encapsulates the first and second light emitting diode dies, the transparent encapsulant having first and second portions, the first portion of the transparent encapsulant including a wavelength-shifting region containing a photoluminescent material, the photoluminescent material having a property to convert at least some of the first light emitted by the first light emitting diode die into third light having a peak wavelength in the green wavelength range and longer than the peak wavelength of the first light, the second portion of the transparent encapsulant does not contain photoluminescent material, wherein the first light emitting diode die is situated in the first portion of the transparent encapsulant and the second light emitting diode die is situated in the second portion of the transparent encapsulant; wherein the first light, emitted by the first light emitting diode die, having a peak wavelength in the blue wavelength range; the second light, emitted by the second light emitting diode die, having a peak wavelength in the red wavelength range; and the third light, emitted by the first light emitting diode die and converted by the photoluminescent material into light having a peak wavelength in the green wavelength range are components of the output light emitted by the semiconductor device, and wherein the output light emitted from the semiconductor device having a high color-rendering index.

2. The device of claim 1, further comprising a submount attached to the mounting structure, wherein at least one of the first and second light emitting diode dies is attached to the submount, and wherein the submount comprises a thermal path for dissipating thermal energy from at least one of the first and second light emitting diode dies.

3. The device of claim 1, wherein at least one of the first and second light emitting diode dies is attached to the mounting structure.

4. The device of claim 1, further comprising a submount attached to the mounting structure, and wherein at least one of the first and second light emitting diode dies is attached to the submount.

5. The device of claim 1, wherein the first and second light emitting diode dies being positioned in a stacked arrangement such that one of the first and second light emitting diode dies is stacked on top of the other light emitting diode die.

6. The device of claim 1, further comprising a reflector cup, and wherein the first and second light emitting diode dies are positioned within the reflector cup.

7. The device of claim 1, further comprising a third light emitting diode die positioned over the mounting structure and within a third portion of the encapsulant, the third light emitting diode die being configured to emit fourth light having a peak wavelength in the blue wavelength range, the third portion of the encapsulant containing a second wavelength-shifting region optically coupled to the third light emitting diode die, the second wavelength-shifting region including a second photoluminescent material having a property to convert at least some of the fourth light emitted by the third light emitting diode die into fifth light having a peak wavelength longer than the peak wavelength of the fourth light, wherein the first light emitting diode die is situated in the wavelength-shifting region and the third light emitting diode die is situated in the second wavelength-shifting region.

8. The device of claim 7, wherein the second photoluminescent material has the property to convert at least some of the fourth light into the fifth light having the peak wavelength in an orange wavelength range.

9. A method for emitting output light from a light emitting device, said method comprising:
    generating first light having a peak wavelength in the blue wavelength range from a first light emitting diode die of the light emitting device;
    generating second light having a peak wavelength in the red wavelength range from a second light emitting diode die of the light emitting device;
    receiving the first light at a wavelength-shifting region optically coupled to at least the first light emitting diode die, including converting at least some of the first light into third light having a peak wavelength longer than the peak wavelength of the first light using a photoluminescent material contained in the wavelength-shifting region of a transparent encapsulant that encapsulates the first and second light emitting diode dies, wherein the transparent encapsulant having first and second portions, the first portion of the transparent encapsulant including the wavelength-shifting region containing the photoluminescent material, the second portion of the transparent encapsulant does not contain photoluminescent material, wherein the first light emitting diode die is situated in the first portion of the transparent encapsulant and the second light diode die is situated in the second portion of the transparent encapsulant; and emitting from the light emitting device the first light having a peak wavelength in the blue wavelength range, the second light having a peak wavelength in the green wavelength range and longer than the peak wavelength of the first light, and the third light having a peak wavelength in the red wavelength range as components of the output light.

10. The method of claim 9, further comprising generating fourth light having a peak wavelength in the blue wavelength range at a third light emitting diode die of the light emitting device, and receiving the fourth light at a second wavelength-shifting region of the transparent encapsulant optically coupled to at least the third light emitting diode die, including converting at least some of the fourth light into fifth light having a peak wavelength longer than the peak wavelength of the fourth light using a second photoluminescent material contained in the second wavelength-shifting region, wherein the first light emitting diode die is situated in the wavelength-shifting region containing the photoluminescent material configured to convert at least some light from the blue wavelength range into light in the green wavelength range the third light emitting diode die is situated in the second wavelength-shifting region containing the second photoluminescent material configured to convert at least some light from the blue wavelength range into light in the orange wavelength range, and the second light emitting diode die is situated in the second portion of the transparent encapsulant that does not contain photoluminescent material.

11. An apparatus for providing illumination, the apparatus comprising:
at least one light emitting device, the light emitting device comprising:
a mounting structure;
a first light emitting diode die positioned over the mounting structure, the first light emitting diode die being configured to emit the light having a peak wavelength in the blue wavelength range;
a second light emitting diode die positioned over the mounting structure, the second light emitting diode die being configured to emit second light having a peak wavelength in the red wavelength range; and
a transparent encapsulant that encapsulates the first and second light emitting diode dies, the transparent encapsulant having first and second portions, the first portion of the transparent encapsulant including a wavelength-shifting region containing a photoluminescent material, the photoluminescent material having a property to convert at least some of the first light emitted by the first light emitting diode die into third light having a peak wavelength in the green wavelength range and longer than the peak wavelength of the first light, the second portion of the transparent encapsulant not containing photoluminescent material, wherein the first light emitting diode die is situated in the first portion of the transparent encapsulant and the second light emitting diode is situated in the second portion of the transparent encapsulant that does not contain photoluminescent material; wherein the first light, emitted by the first light emitting diode die, having a peak wavelength in the blue wavelength range; the second light, emitted by the second light emitting diode die, having a peak wavelength in the red wavelength range; and the third light, emitted by the first light emitting diode die and converted by the photoluminescent material in the first portion of the transparent encapsulant into light having a peak wavelength in the green wavelength range being components of output light emitted from the light emitting device, the output light emitted from the light emitting device having a high color-rendering index; and a light transmitting panel optically coupled to the light emitting device to receive the output light, the light transmitting panel being configured to provide illumination using the output light of the light emitting device.

12. The apparatus of claim 11, wherein the light transmitting panel is a light guide panel.

13. The apparatus of claim 11, wherein the light emitting device further comprises a submount attached to the mounting structure, and wherein at least one of the first and second light emitting diode die is attached to the submount.

14. The apparatus of claim 11, wherein the first and second light emitting diode dies being positioned in a stacked arrangement such that one of the first and second light emitting diode dies is stacked on top of the other light emitting diode die.

15. The apparatus of claim 11, wherein the light emitting device further comprises a third light source positioned over the mounting structure, the third light source being configured to emit fourth light having a peak wavelength in the blue wavelength range, and a second wavelength-shifting region optically coupled to the third light source, the second wavelength-shifting region including a second photoluminescent material having a property to convert at least some of the fourth light into fifth light having a peak wavelength longer than the peak wavelength of the fourth light, wherein the first light source is situated in the wavelength-shifting region and the third light source is situated in the second wavelength-shifting region, wherein the first light having a peak wavelength in the blue wavelength range, the second light having a peak wavelength in the red wavelength range, the third light having a peak wavelength in the green wavelength range, the fourth light having a peak wavelength in the blue wavelength range, and the fifth light having a peak wavelength longer than the peak wavelength of the fourth light being components of output light emitted from the light emitting device, the output light emitted from the light emitting device having a high color-rendering index.

\* \* \* \* \*